United States Patent [19]
Chi

[11] Patent Number: 5,872,032
[45] Date of Patent: Feb. 16, 1999

[54] FABRICATION METHOD FOR A DRAM CELL WITH BIPOLAR CHARGE AMPLIFICATION

[75] Inventor: Min-Hwa Chi, Hsinchu, Taiwan

[73] Assignee: Vanguard International Semiconductor Corporation, Hsin-Chu, Taiwan

[21] Appl. No.: 963,457

[22] Filed: Nov. 3, 1997

[51] Int. Cl.[6] .............................................. H01L 21/8242
[52] U.S. Cl. .......................................... 438/238; 438/241
[58] Field of Search ................................... 438/238, 241, 438/210, 189, 190, 329, 381

[56] References Cited

U.S. PATENT DOCUMENTS

| | | | |
|---|---|---|---|
| 4,677,589 | 6/1987 | Haskell et al. | 365/149 |
| 4,791,611 | 12/1988 | Eldin et al. | 365/177 |
| 5,060,194 | 10/1991 | Sakui et al. | 365/177 |
| 5,066,607 | 11/1991 | Banerjee | 437/52 |
| 5,363,325 | 11/1994 | Sunouchi et al. | 365/149 |
| 5,577,000 | 11/1996 | Asami | 365/205 |
| 5,712,588 | 1/1998 | Choi et al. | 327/525 |

OTHER PUBLICATIONS

Shukuri et al, "A Complementery Gain Cell Technology for Sub–lv Supply DRAMS" Digest of IEDM pp. 1006–1008, 1992.
Shukuri et al, "Super–Low–Voltage Operation of Semi––Static Complementary Gain DRAM Memory Cell", Digest of VLSI Technology Symposium, pp. 23–24, 1993.
Terauchi et al, "A Surrounding Gate Transistor (SGT) Gain Cell for Ultra High Density DRAMS" Digest of VLSI Technology Symposium, pp. 21–22, 1993.
Mukai et al, "A Novel Merged Gain Cell for Logic Compatible High Density Drams" Digest of VLSI Technology Symposium, pp. 155–156, 1997.

*Primary Examiner*—Joni Chang
*Attorney, Agent, or Firm*—George O. Saile; Stephen B. Ackerman; Bill Knowles

[57] ABSTRACT

A DRAM cell structure having charge amplification is disclosed. The DRAM cell has a capacitor to store an electrical charge. The DRAM cell further has a MOS transistor. The gate of the MOS transistor is coupled to a word line control to activate and deactivate the MOS transistor. The drain MOS transistor is coupled to one plate of the capacitor. The DRAM cell has a bipolar transistor to amplify the electrical charge stored on the capacitor. The bipolar transistor has a base that is the source for the MOS transistor. The base of the bipolar transistors is formed by masking and implanting a material of the first conductivity type adjacent to the gate to form the base. The collector of the bipolar transistor is the semiconductor substrate. The bipolar transistor has an emitter coupled to a bit-lines control which when activated will sense the charge amplified by the bipolar transistor. The emitter is formed by masking and implanting a material of the second conductivity type within the material of the first conductivity type. The emitter is implanted to ensure a large overlap of the gate of the emitter. The overlap of the gate of the emitter will ensure generation of gate induced drain leakage current to discharge the storage capacitor during writing of a logical "0" to the storage capacitor.

6 Claims, 10 Drawing Sheets

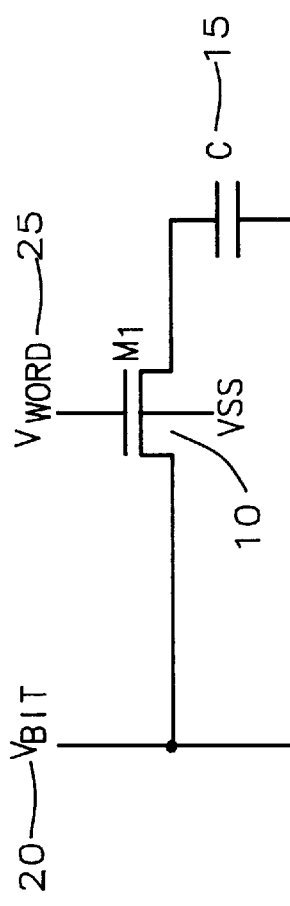
FIG. 1a – Prior Art
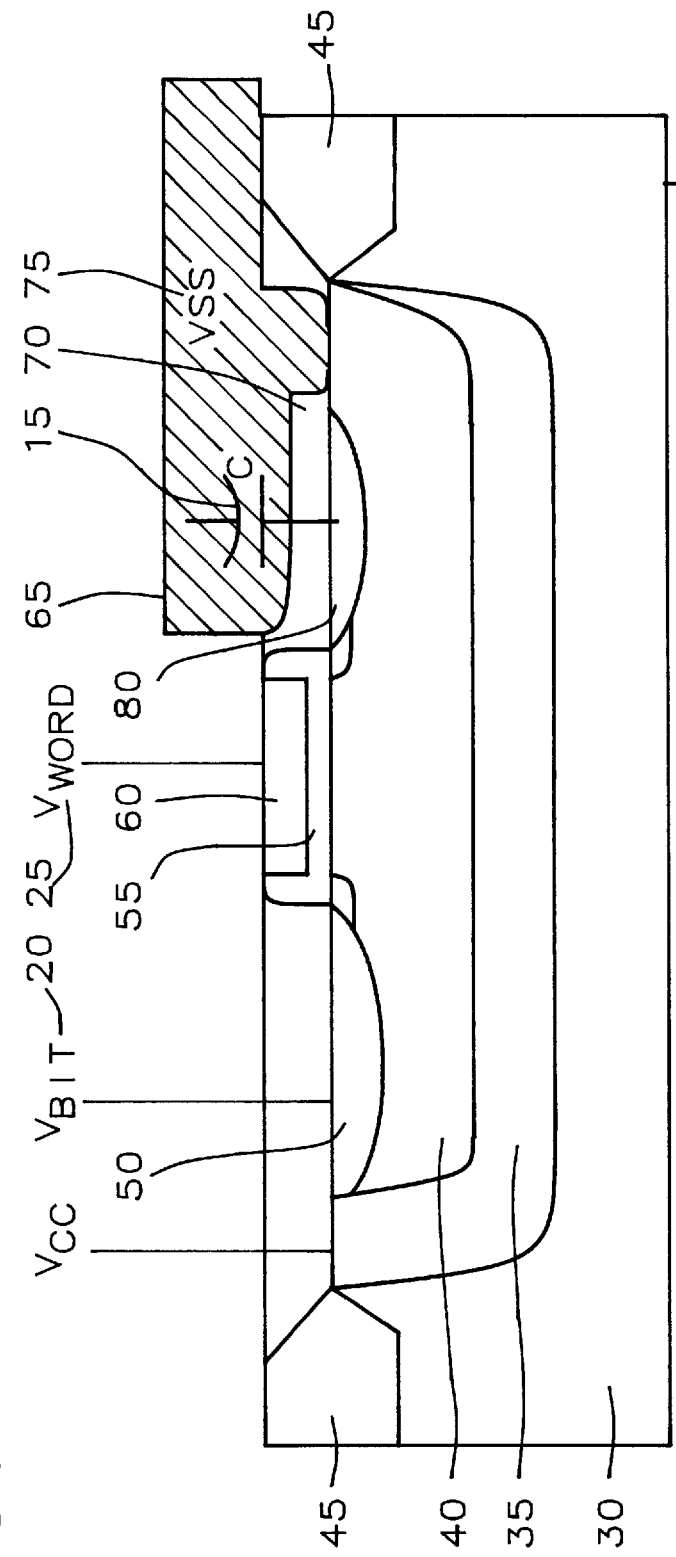
FIG. 1b – Prior Art

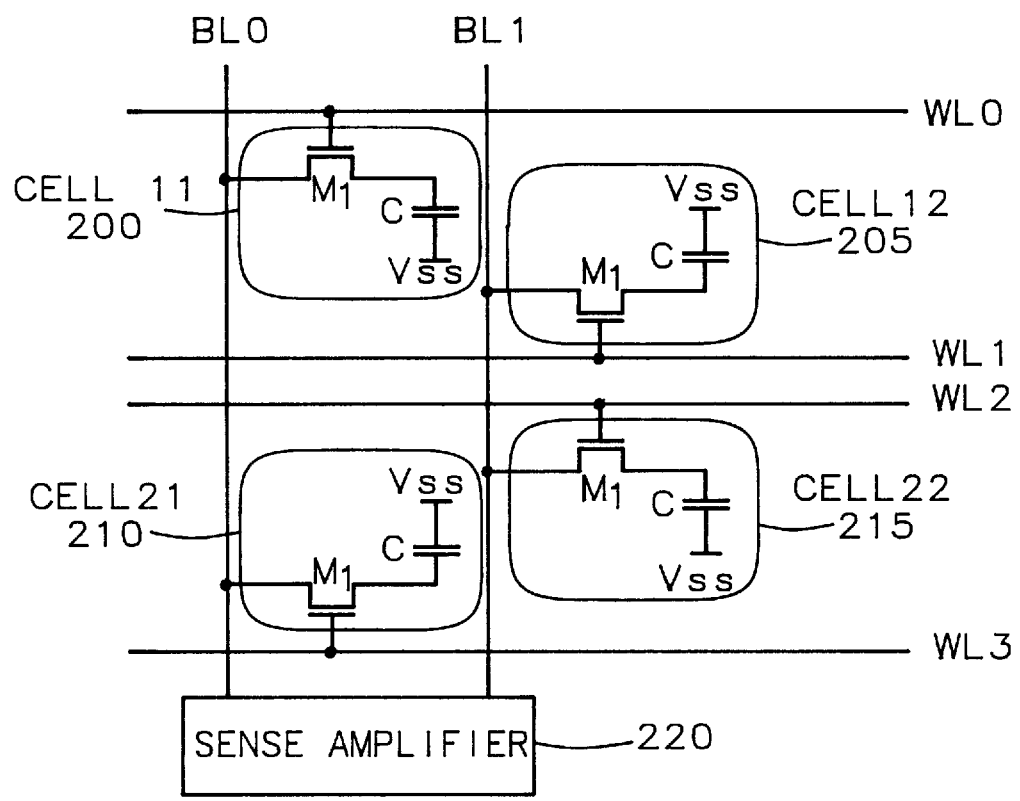
FIG. 2 - Prior Art

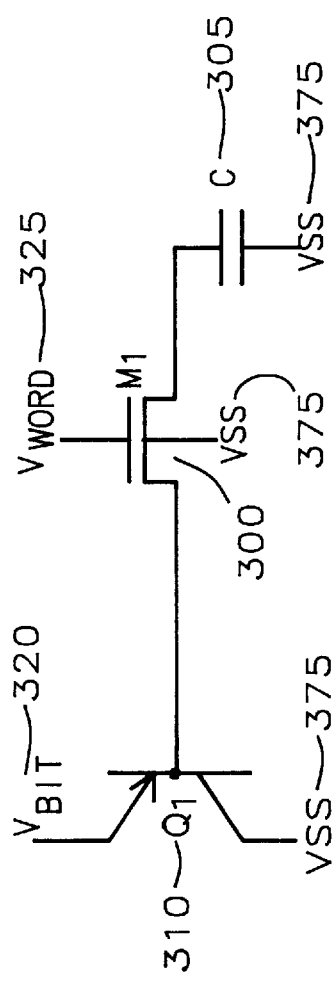
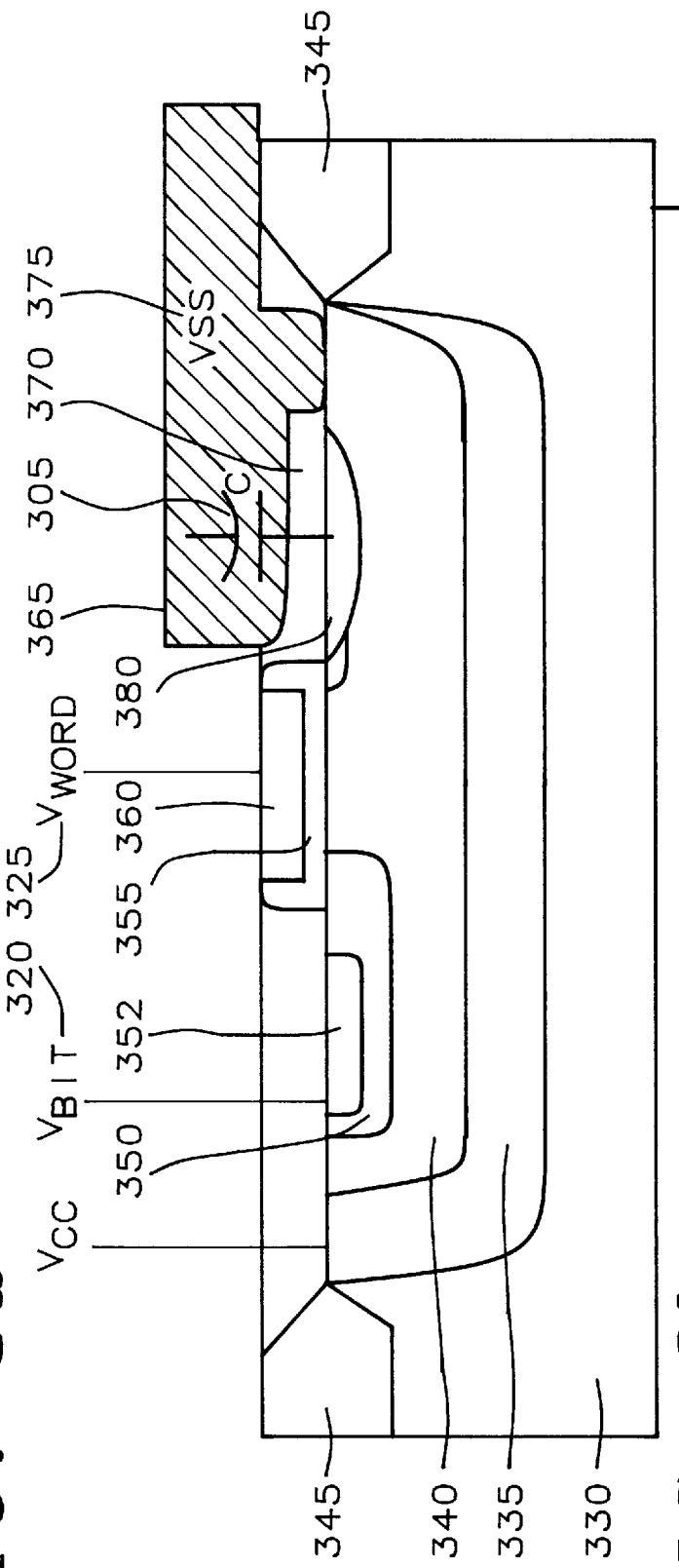
FIG. 3a
FIG. 3b

FABRICATION METHOD FOR A DRAM CELL WITH BIPOLAR CHARGE AMPLIFICATION

BACKGROUND OF THE INVENTION

1. Field of the Invention

This invention relates to the dynamic random access memories (DRAM) and more particularly to the structures and methods of fabrication of DRAM's with charge amplification.

2. Description of Related Art

The fabrication and structure of DRAM cells and DRAM array are well known in the art. Typical cell structures for high density DRAM in prior art is composed of one transistor M1 10 for switching charges and one storage capacitor C 15 for storing charges as illustrated in FIG. 1a. The transistor M1 10 will be an n-MOS transistor fabricated in a triple well as shown in FIG. 1b. A deep N-well 35 will be formed in a p-type substrate 30. The area for the deep n-well 35 will be formed as openings during the formation of the insulation are by the local oxidation of the silicon substrate (LOCOS) 45. Within the deep n-well 35 a shallower p-well 40 will be formed. The gate 60 of the n-MOS transistor M1 10 will be formed as a conductive material such as polysilicon placed over an insulating gate oxide 55 to define the channel area that will between the drain 50 and source 80 of the n-MOS transistor M1 10.

The capacitor C 15 is formed by placing a conductive metal connected to the substrate biasing voltage source $V_{ss}$ 75 on a dielectric 70 placed over the $N^+$ drain 80 of the transistor M1 10. The capacitor C 15 as shown is diagrammatic. The particular structure of the capacitor C 15 is well known and shown in "The Evolution Of DRAM Cell Technology" by B. El-Kareh et al., Solid State Technology, May 1997, pp. 89–101. In order to maintain the minimum storage capacitance of 30–40 fF of a cell, the structure of the DRAM cell results in complex semiconductor processing to develop these structures.

A corresponding DRAM cell using p-MOS transistor can certainly be used with polarity and operation bias reversed accordingly.

The deep n-well 35 is typically biased to the power supply voltage source $V_{cc}$ (i.e. the highest potential on chip) and the p-well is biased to substrate biasing voltage source $V_{ss}$ 75 (i.e. the lowest voltage on chip). The substrate biasing voltage source $V_{ss}$ 75 may be biased below ground (i.e. negative potential) so that the leakage current through the pass transistor $M_1$ 10 is reduced. The presence of charge in the storage capacitor C 15 indicates a logical "1" and its absence of charge indicates a logical "0". The storage capacitor C 15 is connected to n+ drain 80 of the transistor $M_1$ 10, and the other n+ source 50 of the transistor $M_1$ 10 is connected to bit-line $V_{bit}$ 25 that controls the reading and writing of the DRAM cell. The gate of the MOS transistor M1 10 is connected to the word line $V_{word}$ to control the selection of the DRAM cell.

The DRAM cells Cell 11 200, Cell 12 205, Cell 21 210, Cell 22 215 are arranged in arrays of rows (word-lines WL0, WL1, WL2, and WL3,) and columns (bit-lines or BL0 and BL1) as shown in FIG. 2. One popular DRAM array is the folded bit-line architecture. Each pair of bit-lines BL0 and BL1 is connected to one sense amplifier 220 where one Bit-lines BL0 or BL1 serves as reference bias and the other BIT-LINES BL0 or BL1 serves as bit-line sensing during read operation. During write operation, the bit-line BL0 and BL1 is charged to either $V_{cc}$ to write a logical "1" or $V_{ss}$ to write a logical "0". The selected word-line WL0, WL1, WL2, or WL3 is charged to $V_{cc}$ so that all transistors connected to the same row turn on and the capacitor of each cell are charged to $V_{cc}$ or $V_{ss}$ representing information of "1" and "0" respectively. Before read operation starts, the bit-lines BL0 and BL1 are precharged to a voltage-$V_{cc}/2$. To start reading a cell, the selected word-line WL0, WL1, WL2, or WL3 is raised to $V_{cc}$, turning on all transistors connected to the word-line WL0, WL1, WL2, or WL3. Each sense amplifier 220 detects the polarity of charge stored on capacitor C with respect to the reference Bit-lines BL0 and BL1 voltage (i.e. Vcc/2).

The signal appearing at the input of sense amplifier 220 is very small (~100–200 mv), since the cell capacitance is small (<10%) compared to the bit-line capacitance. Throughout generations of DRAM, the minimum storage capacitance C needs to be 30–40 fF as described above in order to maintain read performance.

The requirement of large storage capacitance of conventional one-transistor cell results in high and multi-layered stack or deep trench capacitors, which is one of the major scaling limits in DRAM technology. Therefore, there is a need for innovations for reducing the requirement of storage capacitance in DRAM cell. One DRAM cell of the prior art adds a bipolar transistor to the DRAM cell for charge amplification as shown in FIG. 3a. DRAM cells with charge amplification are disclosed in U.S. Pat. No. 4,677,589 (Haskell et al.) and U.S. Pat. No. 5,363,325 (Sunouchi et al.) and shown in FIGS. 3a and 3b. The structure of the cell is similar to that of FIGS. 1a and 1b. The n-MOS transistor M1 300 acts to switch the charges to and from the capacitor C 315. However, transistor Q1 310 acts to amplify the signal developed by the charges present on the capacitor to allow smaller charges to be present and still detect the logical "1" or the logical "0". The write of a logical "1" occurs when the bit-lines Vbit 320 is brought to the voltage level $V_{cc}$. This will allow the p/n junction formed by the emitter-base 350 of the bipolar transistor Q1 310 to conduct thus charging the capacitor C 305 to nearly the value of the power supply voltage source $V_{cc}$.

When the cell is to be written to logical "0", the bipolar transistor Q1 310 will be nonconducting and any charge present on the capacitor C 305 will have to leak through parasitic paths from the capacitor C 315. This will cause the writing of a logical "0" to be very slow.

The structure of the bipolar transistor Q1 310 is formed by diffusing a p+emitter 352 in the area that forms the N source of the n-MOS transistor M1 300. The bipolar transistor Q1 310 is thus formed as a merged transistor with the n-MOS transistor M1 300 by the p+ emitter 352, the N-base 350 (also the source of the n-MOS transistor M1 300), and the p-well 340 that acts as the collector.

"A Complementary Gain Cell Technology For Sub-1v Supply Dram's", Shukuri et al., Digest of IEDM, p. 1006, 1992 and "Super-Low-Voltage Operation Of Semi-Static Complementary Gain DRAM Memory Cell", Shukuri et al., Digest of VLSI Technology Symposium, p. 23, 1993 describes a DRAM cell incorporating charge amplification. A complementary cell that has an n-MOS transistor and a p-MOS transistor with a floating gate structure acts as the storage node. The floating gate stores the charge representing the logical "1" or logical "0" and causes a shift in the threshold voltage of the pMOS transistor to allow reading of the logical "1" or logical "0" from the storage cell.

"A Surrounding Gate Transistor (SGT) Gain Cell For Ultra High Density Dram's", M. Terauchi, et. al., Digest of VLSI Technology Symposium, p. 21, 1993 discloses a surrounding gate transistor gain cell. The surrounding gate transistor cell has an n-MOS transistor, a junction field effect transistor (FET), and a charge storage capacitor. The charge storage capacitor is formed as the gate of the junction FET.

"A Novel Merged Gain Cell For Logic Compatible High Density Dram's", M. Mukai, et. al., Digest of VLSI Technology Symposium, p. 155, 1997 discloses a merged DRAM cell that has a p-MOS transistor, an n-MOS transistor, a n-type junction FET, a second bit-line for write operation. The p-MOS transistor controls the charge transfer, the n-MOS transistor is used for charge storage and a read transistor, and the n-type junction FET is used to control the read out current. The charge storage occurs in the channel region of the n-MOS transistor.

The write and read operations of the DRAM cell of Shukuri et al., M. Terauchi, et. al., and M. Mukai, et. al., are handled by separate transistors and bit-lines to avoid the slow discharging as the bipolar/MOS transistor gain cell of FIGS. 3a and 3b as above described.

U.S. Pat. No. 5,066,607 (Banerjee) teaches a two transistor gain type DRAM cell. The two transistor DRAM cell has a high quality pass transistor and a large capacitance storage element. The gate of a gain transistor is coupled between the storage element and the pass transistor to amplify the charge at the storage element during a read operation.

U.S. Pat. No. 4,791,611 (Eldin et al.) discloses a memory cell that includes a bipolar transistor, a junction FET, and a capacitor. The capacitor comprises a MOSFET which is operated in the accumulation mode. The bipolar transistor controls the writing of the capacitor, while the junction FET controls the reading of the data from the capacitor.

SUMMARY OF THE INVENTION

An object of this invention is to provide a structure for a DRAM cell having charge amplification.

Another object of this invention is to provide a structure of a DRAM cell having a fast write operation.

To accomplish these and other objects a DRAM cell is fabricated within an array of DRAM cells upon a semiconductor substrate. The DRAM cell has a charge storage capacitor to store an electrical charge representing a bit of digital data. The charge storage capacitor has a first plate and a second plate coupled to a substrate biasing voltage source.

The DRAM cell has a MOS transistor. The gate of the MOS transistor is coupled to a word line control to activate and deactivate the MOS transistor. The drain MOS transistor is coupled to the first plate of the charge storage capacitor.

After well-known formation of wells and LOCOS isolation, a layer of thin oxide is grown on the semiconductor substrate to form a gate oxide. Then depositing masking and etching a conductive material such as polysilicon on the gate oxide to form the gate.

The DRAM cell has a bipolar transistor to amplify the electrical charge stored on the charge storage capacitor. The bipolar transistor has a base that functions as the source for the MOS transistor. The base of the bipolar transistors is formed by placing a first implant mask and implanting a first material of the first conductivity type adjacent to the gate oxide to form the base. The implanting of the base has a high energy and a large angle to provide a large current gain for the bipolar transistor. The collector of the bipolar transistor is formed by a bulk material of the semiconductor substrate and is coupled to a substrate biasing voltage source. The bipolar transistor has an emitter coupled to a bit-lines control which when activated will sense the charge amplified by the bipolar transistor. The emitter is formed by placing a second implant mask and implanting a second material of the second conductivity type within the first material of the first conductivity type and adjacent to the gate. The implanting has a high dosage and high tilted angle of the second material of the second conductivity type to ensure a large overlap of the gate of the emitter. The overlap of the gate of the emitter is to ensure generation of gate induced drain leakage current at a surface of the semiconductor wafer in the area of the overlap so as to provide a discharge of the storage capacitor during writing of a logical "0" to the storage capacitor.

BRIEF DESCRIPTION OF THE DRAWINGS

FIGS. 1a and 1b shows schematically and cross-sectionally a conventional DRAM cell of the prior art.

FIG. 2 shows a schematic diagram of a folded bit-line DRAM architecture of the prior art.

FIGS. 3a and 3b shows schematically and cross sectionally a conventional DRAM cell with charge amplification of the prior art.

DETAILED DESCRIPTION OF THE INVENTION

Figure 4:
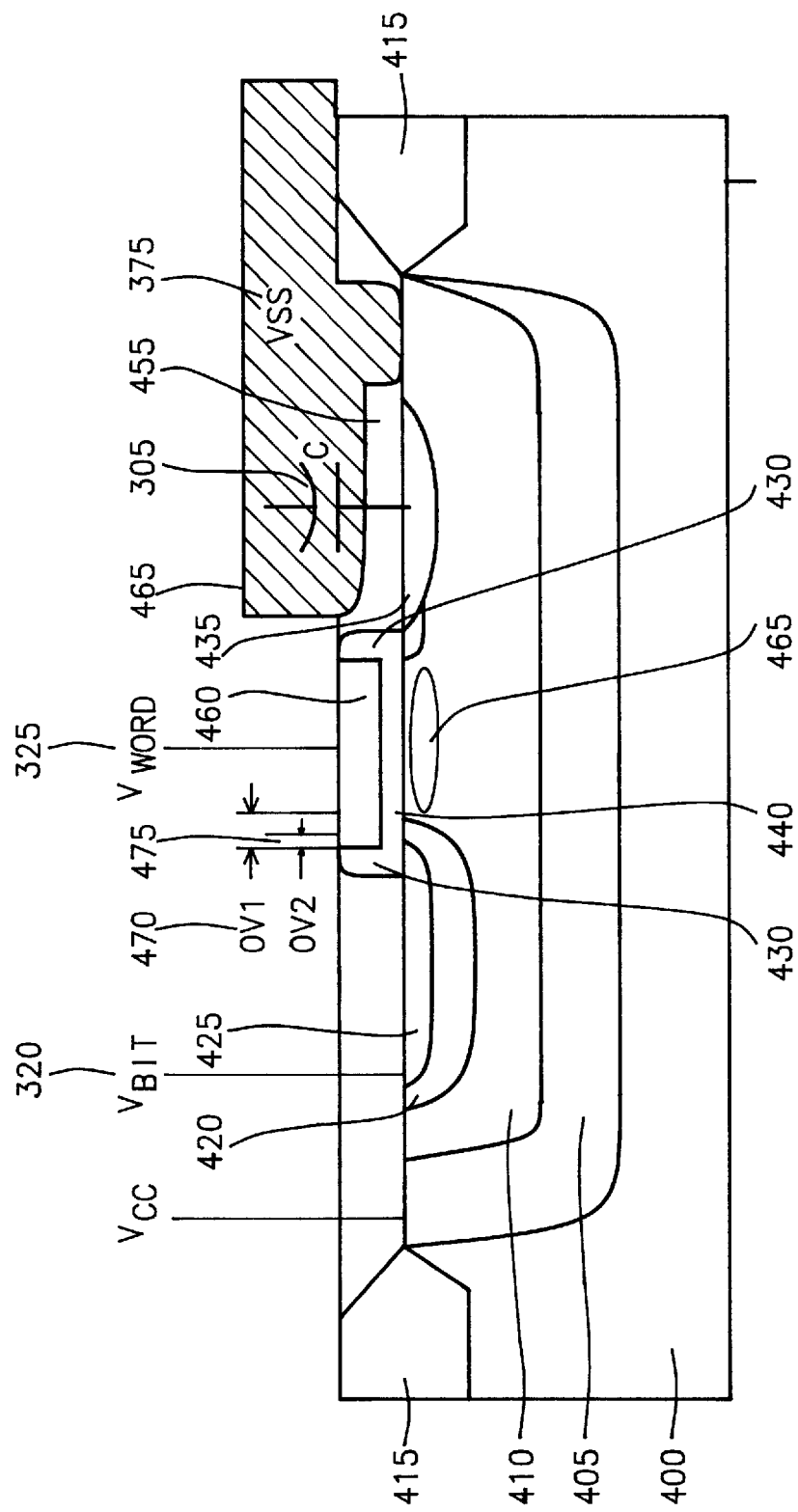
FIG. 4 shows a cross sectional diagram of a DRAM cell with charge amplification of this invention.

The DRAM cell structure of this invention is shown in FIG. 4 with the schematic of the lumped components as shown in FIG. 3a. The DRAM cell structure of this invention has one "merged" transistor and one storage capacitor within a triple well front end as above described. The "merged" transistor is similar to a typical n-MOS transistor except the bit-lines $V_{bit}$ 320 is attached to a dual implanted $p^+$ emitter 425/n-base 420, so that there is a parasitic bipolar pnp transistor Q1 310. The parasitic bipolar pnp transistor Q1 310 is formed as the $p^+$ emitter 425, the n-base 420, and the p-well collector 410. The parasitic pnp transistor Q1 310 is merged with the n-MOS transistor M1 300 (the n-base 420 is the source of the n-MOS transistor M1 300). The n-base 420 is floating during operations of read and write. The storage capacitor C 305 is connected to the drain of the n-MOS transistor M1 300. The parasitic bipolar pnp transistor Q1 310 is used to amplify the charge stored on the capacitor during read operation as if the stored charge increases by the current gain (β) of the parasitic bipolar pnp transistor Q1 310. Thus the requirement of a minimum cell capacitance is greatly reduced. This will reduce the height of the stacked capacitor or the depth of the trench capacitor as above described.

Figure 8:
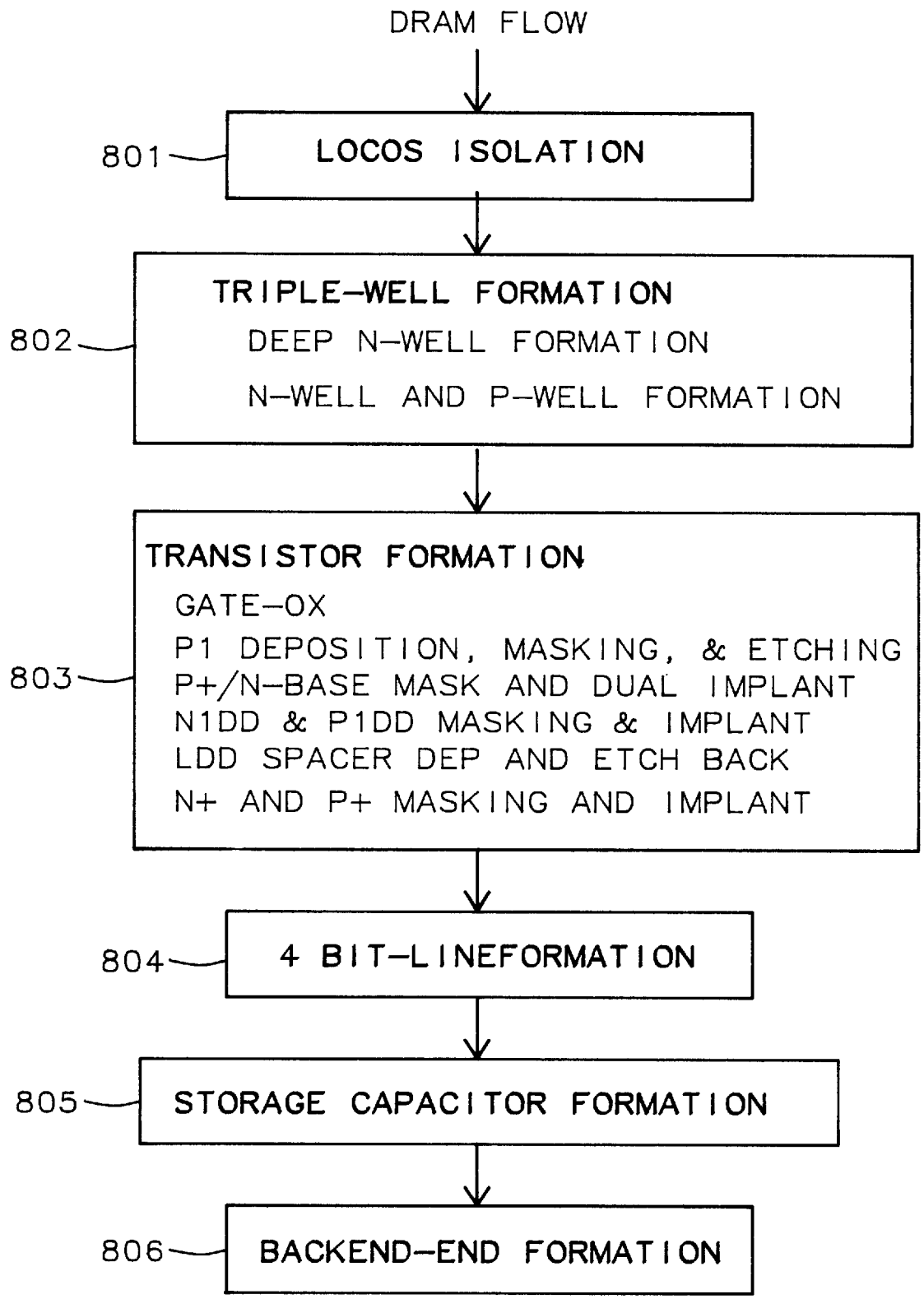
FIG. 8 shows a flow diagram of the process to fabricate a DRAM cell with charge amplification of this invention.

Refer now to FIGS. 4 and 8 to understand the process of fabrication and the structure of the DRAM cell of this invention. Again the schematic of the lumped components are shown in FIG. 3a. The structure of the DRAM cell of this invention has a cell area defined within an opening made during the LOCOS isolation 801 of the substrate. The triple well formation 802 begins by the diffusion of an n-type material to form deep n-well 405 into the cell area. The deep n-well 405 is connected later in the process during the back end formation to the power supply voltage source $V_{cc}$ to bias the deep n-well 405 to minimize the flow of leakage currents to the substrate p-sub 400 and the coupling of noise from peripheral circuitry to the DRAM cell.

A p-type material is then diffused into the deep n-well 405 to form the p-well 410. The p-well 410 is connected later in the processing during the back end formation 806 to the metal that will be connected to the substrate biasing voltage source $V_{ss}$ 375. The substrate biasing voltage source $V_{ss}$ 375 is generally the most negative voltage on the memory array. The biasing of the p-well 410 to the substrate biasing voltage source $V_{ss}$ 375 will further minimize the bit-line capacitance and also serves as the collector for the pnp bipolar formed in later process.

Additionally an n-type material will be diffused into the deep n-well 405 for the construction of p-MOS transistors in the peripheral circuitry. This step is included herein for more completeness of the description of the processing of the DRAM array.

The formation 803 of the transistors within the cell area begins with the growth of the gate oxide 440 in the area of the cell that is to be the channel 465 of the n-MOS transistor M1 300. A polysilicon gate 460 is formed in the gate area above the channel 465.

The merged pnp transistor Q1 310 is formed by the implantation of an n-type material to form the n-base 420. The implantation of the n-base 420 is formed as phosphorus ($P^{31}$) implanted at an implant energy of from about 50 Kev to 100 Kev until the n-base has approximately $10^{13}$ to approximately $10^{14}$ electrons per $cm^3$ density. The n-base implant energy must be sufficiently high and the implant tilt angle must be sufficiently large so that the n-base will be deeper than the $p^+$ emitter. This will allow the merged bipolar pnp transistor Q1 310 to have a high current gain ($\beta$).

Next to continue the formation of the merged pnp transistor Q1 310, the $p^+$ emitter 425 is now formed by the implantation of a p-type material in the area above the n-base 420. The $p^+$ emitter 425 will be formed by the implantation of Boron Fluoride ($BF_2$) at an implant energy 10 Kev until form approximately $10^{15}$ to approximately $10^{16}$ holes have been implanted. The $p^+$ emitter 425 implant with the high dosage and large tilt angle ensures a large enough overlap OV2 475 of the $p^+$ emitter 425 and the gate area 460.

The formation of the drain of the n-MOS transistor M1 300 and all the transistors in the control circuitry at the periphery of the DRAM array are formed by the masking and implantation of the p and n-type lightly doped drains (Idd). The Idd spacer oxide is deposited and etched at the edges of the gate. The $n^+$ and $p^+$ masking and implant complete the formation of the $N^+$ drain of the n-MOS transistor.

The bit-lines $V_{bit}$ 320 are formed 804 and connected to the $p^+$ emitter 425. The formation and connecting process for the bit-lines is well known in the art.

Further the storage capacitor C 305 is formed 805. The structure of the storage capacitor C 305, as shown in FIG. 4, has a dielectric layer placed over the drain of the n-MOS transistor M1 300. A metal layer is placed over the dielectric and connected to the substrate 400 biasing voltage source $V_{ss}$ 375. This structure is meant to be illustrative. The storage capacitor C 305 will be formed 805 as a stacked capacitor or a trench capacitor, the formation of which is well known in the art. In the case of a trench capacitor, it will be formed prior to the transistor formation 803 and subsequent to the triple well formation 802.

Finally the back end formation 806 will provide the contacts and metal interconnections necessary to provide the internal wiring for the DRAM array, the internal wiring to the control circuitry at the periphery and the wiring to the bonding pads to connect the DRAM array to external circuitry.

The storage capacitor C 305 has been described as standard stacked or trench capacitors. However, the charge amplification of the pnp transistor Q1 310 will allow the simplification of the storage capacitor C 305 to that of the gate to source and the gate to drain capacitance of a standard MOS Transistor. This will allow the simplification of the fabrication process to that of a standard CMOS logic process.

Figure 5:
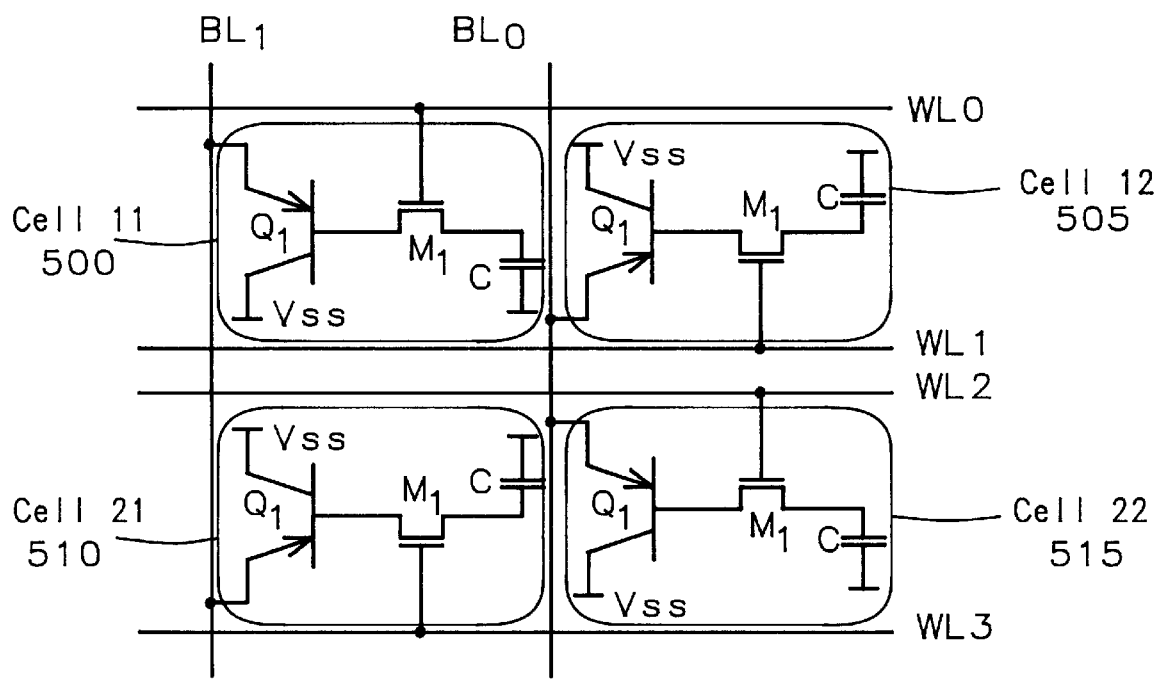
FIG. 5 shows a schematic diagram of an array of DRAM cells with charge amplification of this invention.

Referring now to FIG. 5, the architecture of an array of DRAM cells Cell11 500, Cell12 505, Cell21 510, Cell22 515 of this invention can be that of a folded bit-line array, that is well known in the art. As shown in FIG. 4, the gate of the n-MOS transistor M1 300 of each cell is connected to the word line $V_{word}$. Multiple word lines WL0, WL1, WL2, and WL3 will be connected to the control circuitry in the periphery to select a row of the DRAM cells Cell 11 500, Cell12 505, Cell21 510, Cell22 515. The $p^+$ emitter 425 of the bipolar pnp transistor Q1 310 is connected to a bit-lines BL0 and BL1 as described above. The bit-lines BL0 and BL1 will be connected to control circuitry in the periphery to control the selection of a column WL0, WL1, WL2, and WL3 of the DRAM array.

The entire array of DRAM cells Cell11 500, Cell12 505, Cell21 510, Cell22 515 will be placed in the deep n-well 405. The biasing of the deep n-well 405 will be such that noise generated in the control circuitry in the periphery circuits will be isolated from the array of DRAM cells.

Figure 6A:
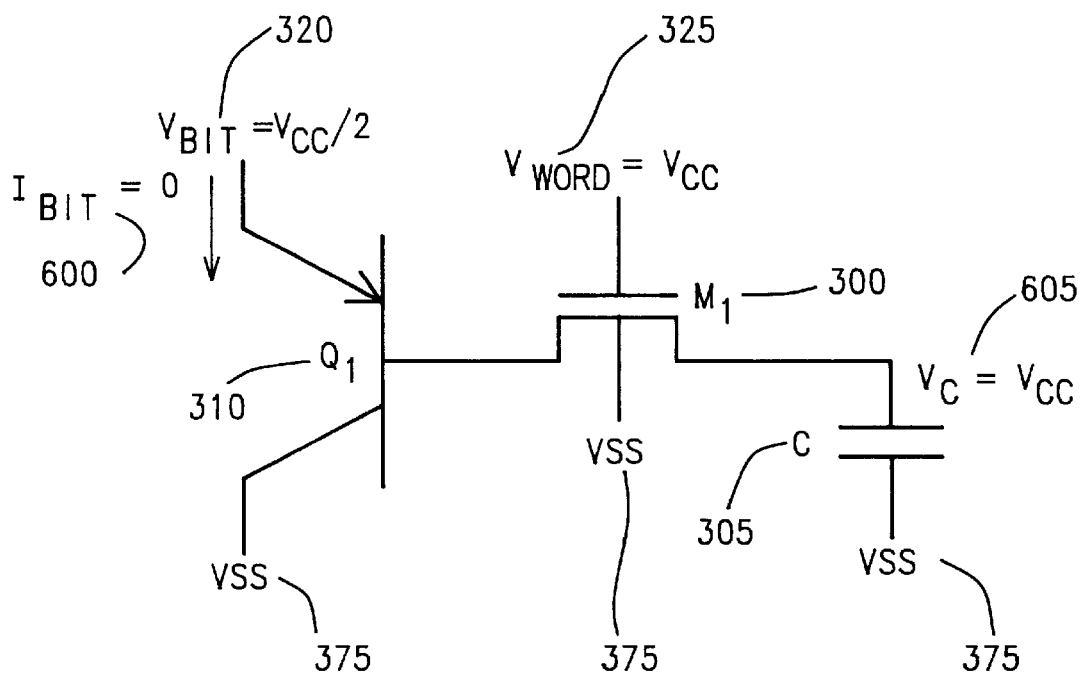
FIGS. 6a and 6b shows a schematic of the DRAM cell with charge amplification of this invention during a read operation.
Figure 6B:
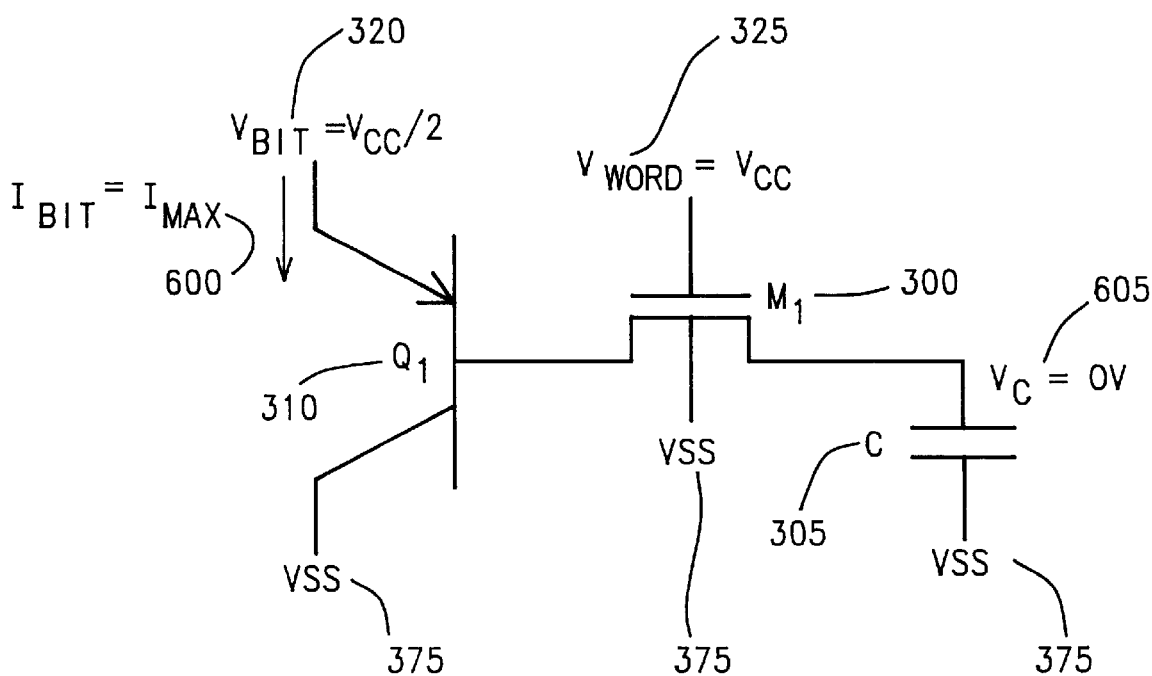

To understand the operation of the DRAM cell of this invention during a read operation, refer now to FIGS. 6a and 6b. For the reading of a logical "1" as shown in FIG. 6a, the storage capacitor C 305 is charged to a voltage level $V_c$ 605 that approaches that of the power supply voltage source $V_{cc}$. The word line voltage $V_{word}$ 325 is at the level of the power supply voltage source $V_{cc}$ and the voltage level of the bit-lines $V_{bit}$ 320 is precharged to the level of one half the power supply voltage source $V_{cc}/2$.

With the voltage of the word line $V_{word}$ 325 at the level of the power supply voltage source $V_{cc}$, the n-MOS transistor M1 300 will be placed in a conductive state, thus placing the voltage $V_c$ 605 stored on the storage capacitor C 305 at the base 420 of the pnp transistor Q1 310.

The pnp transistor Q1 310 will be placed in a non conductive state and no current $I_{bit}$ 600 will flow in the bit-lines $V_{bit}$. This will be sensed by the sense amplifier in the control circuitry at the periphery of the DRAM array as a logical "1".

Refer now to FIG. 6b to understand the reading of the logical "0" from the DRAM cell. The voltage $V_c$ 605 of the storage capacitor C 305 will approach 0 V. Again the word line voltage $V_{word}$ 325 will be at a voltage approaching that of the power supply voltage source $V_{cc}$. The voltage of the bit-lines $V_{bit}$ 320 will again also be precharged to a voltage that is one half the power supply voltage source $V_{cc}/2$.

The n-MOS transistor M1 300 will be conducting and place the voltage $V_c$ 605 of the storage capacitor C 305 at the base 420 of the pnp transistor Q1 310. The pnp transistor Q1 310 will be conducting the current $I_{bit}$ 600 at the maximum available current level $I_{max}$. This level of the bit-lines current $I_{bit}$ will interpreted by the sense amplifier as the logical "0".

Figure 7A:
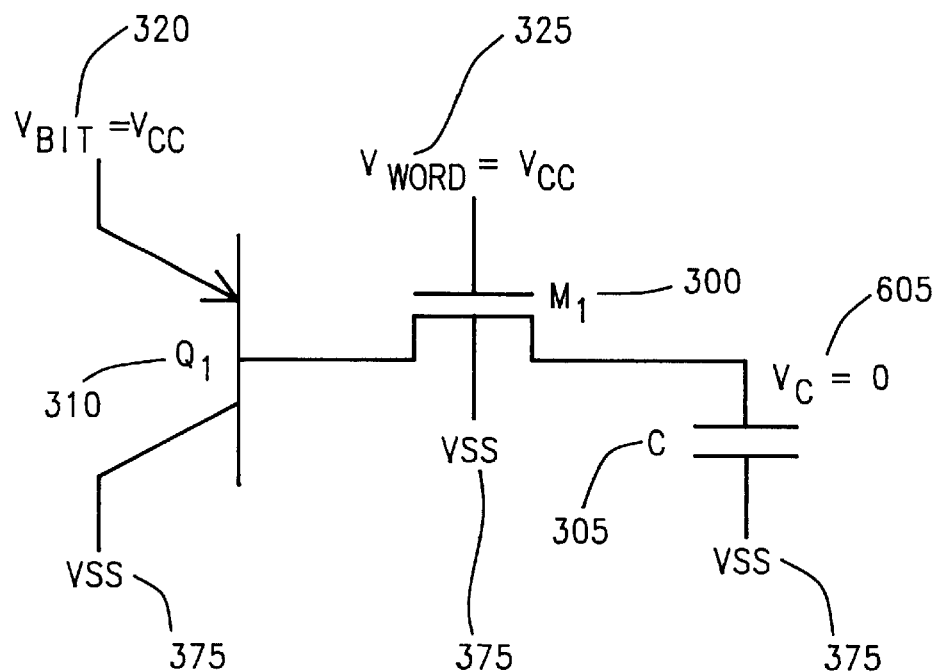
FIGS. 7a and 7b shows a schematic of the DRAM cell with charge amplification of this invention during a write operation.

Refer now to FIGS. 7a, 7b, 7c, and 7d to understand the write operation of the DRAM cell. FIG. 7a shows the writing of a logical "1" to the DRAM cell. The voltage of the word line $V_{word}$ 325 will be set to the power supply voltage source $V_{cc}$ to activate the n-MOS transistor M1 300 to conduct. The voltage of the bit-lines $V_{bit}$ 320 will be set to the level of the power supply voltage source $V_{cc}$. If the storage capacitor C 305 has been discharged to a level approaching 0 V, p/n junction of the emitter-base junction of the pnp transistor Q1 310 will be forward biased to charge the storage capacitor C 305 to the level approaching the power supply voltage source $V_{cc}$. If, however, the storage capacitor C 305 is already charged to the level of the power supply voltage source $V_{cc}$, there will be no response to the change.

The operation of reading a logical "1" and logical "0" and writing a "1" of the DRAM cell of this invention to this point is not different to that shown in the prior art. The writing of the logical "0" is different as described below.

Figure 7B:
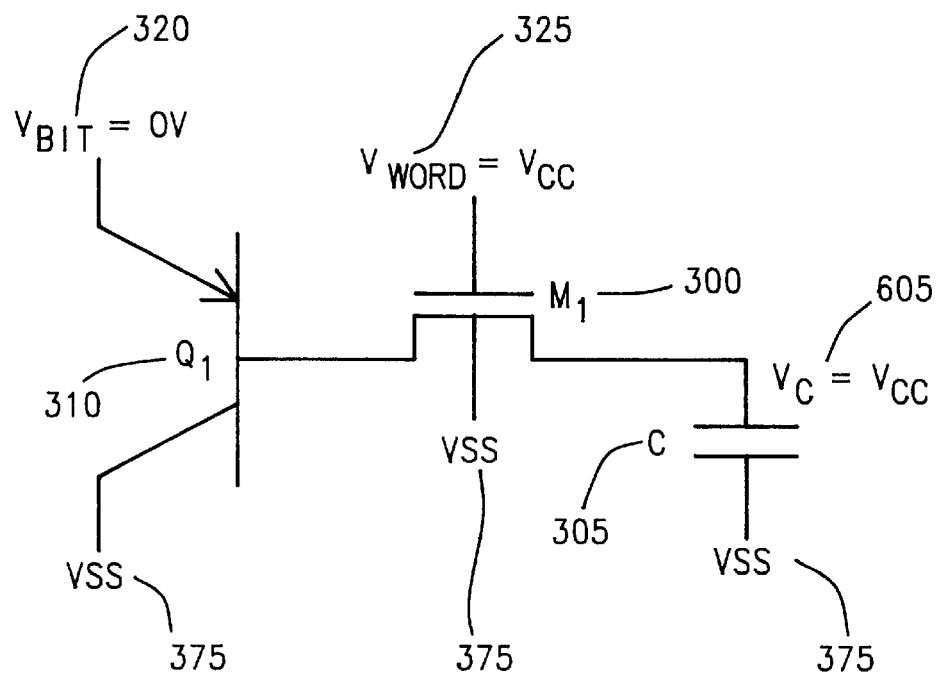

Refer now to FIG. 7b to understand the writing of a logical "0" to the DRAM cell. The voltage of the word line $V_{word}$ 325 is set to the power supply voltage source $V_{cc}$ to activate the n-MOS transistor M1 300. The voltage of the bit-lines $V_{bit}$ 320 is set to 0 V. As biased, the pnp transistor Q1 310 will be in a nonconductive state. If the storage capacitor C 305 is discharged to a level $V_c$ 605 that is 0 V, the cell will have already been set to a logical "0" and no response is necessary. If however, the storage capacitor C 305 is charged to a voltage $V_c$ 605 that is approaching the voltage level of the power supply voltage source $V_{cc}$, the bipolar pnp transistor Q1 310 will again be in a nonconductive state. To overcome the slow discharge of the storage capacitor C 305 due to leakage as in the prior art, a gate induced drain leakage (GIDL) current will cause the rapid discharge of the storage capacitor C 305.

Figure 7C:
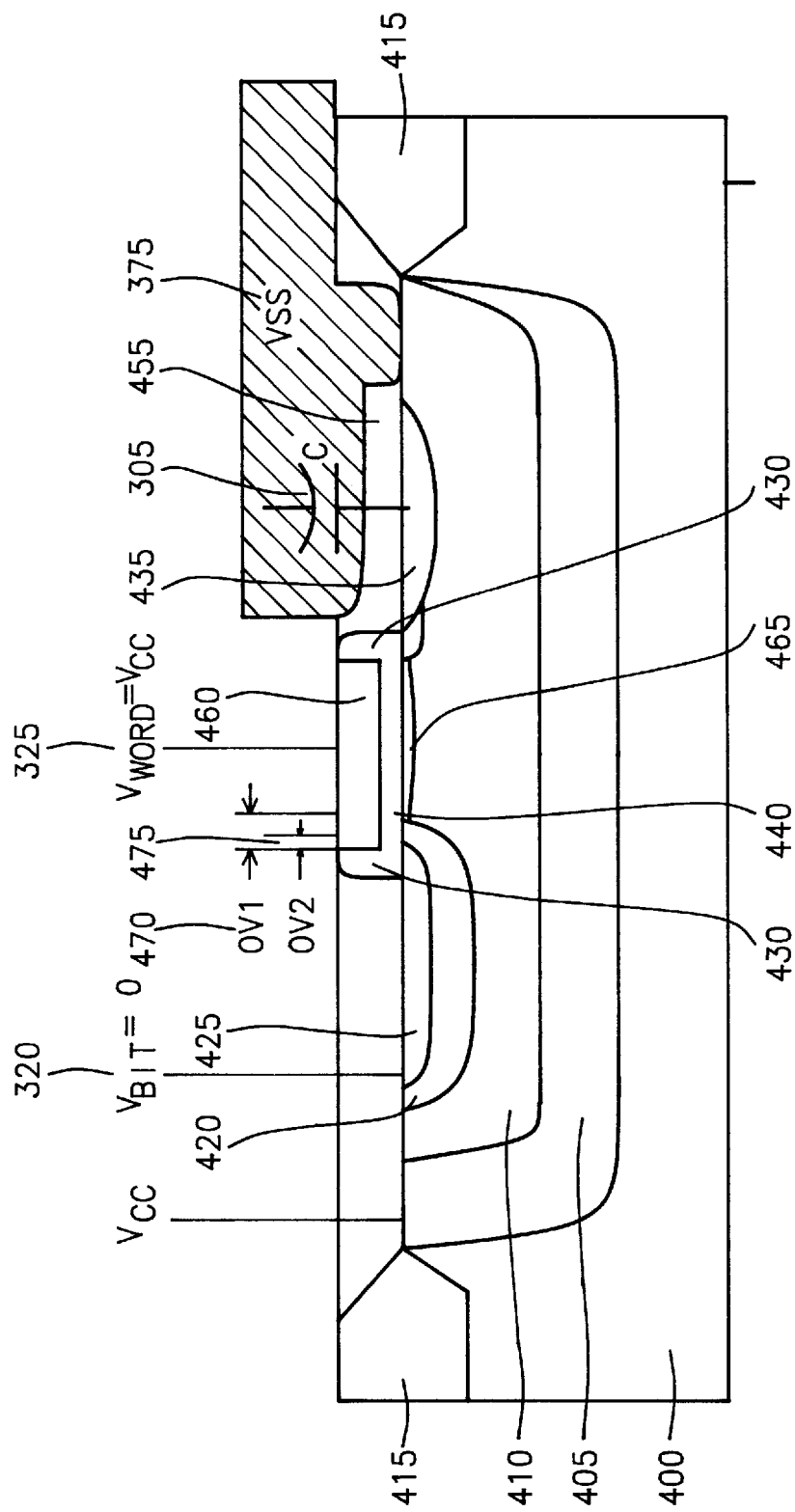
FIGS. 7c and 7d shows a cross sectional view and an energy diagram of the DRAM cell with charge amplification of this invention during a write 0 operation.
Figure 7D:
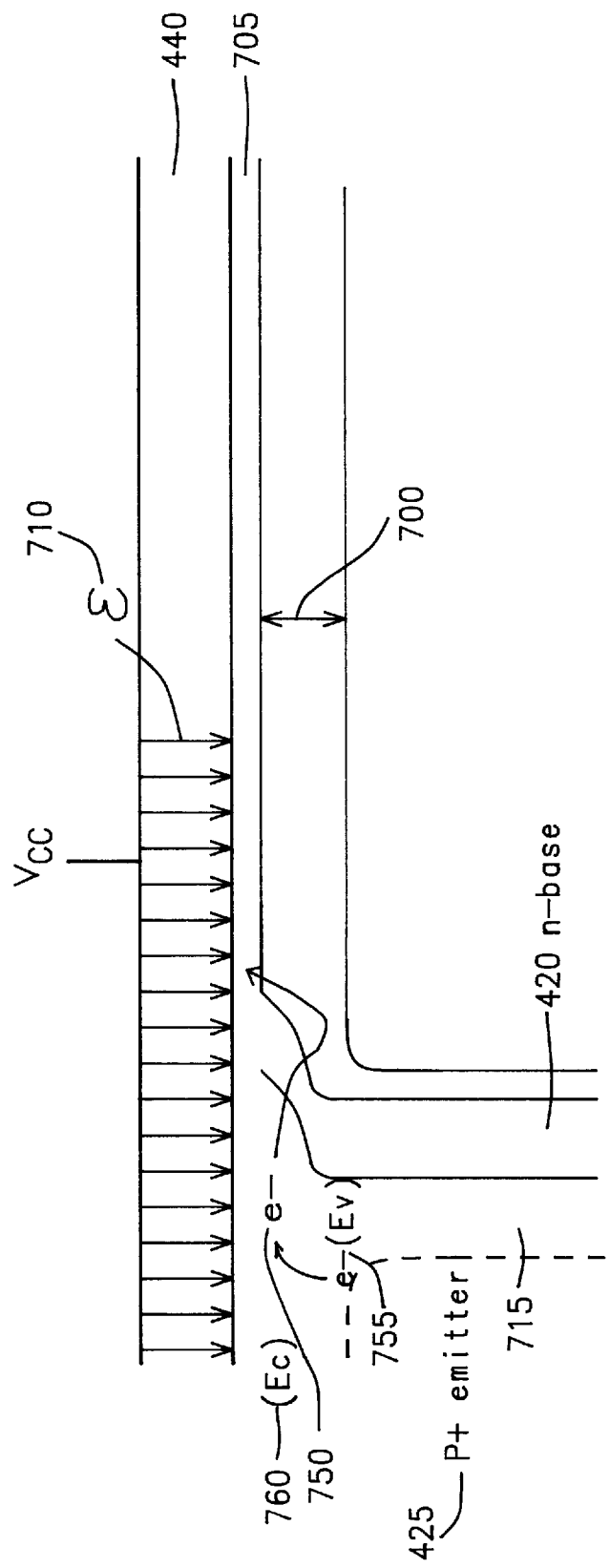

Refer now to FIGS. 7c and 7d to understand the GIDL effect. The overlaps OV1 470 and OV2 475 of the gate over the n-base 420 and the p$^+$ emitter 425 will allow electrons e$^-$ to create a current at the surface of the p$^+$ emitter 425 to flow to the n-base 420 through the channel 465 to discharge the storage capacitor C 315.

The field $\epsilon$ 710 created by the voltage at the word line $V_{word}$ 325 will cause electrons to be generated at the interface of the p$^+$ emitter 425 by band-to-band tunneling. The gate oxide 440 must be thin enough so that the vertical field $\epsilon$ 710 is large enough (>2 Mev/cm) to trigger the band-to-band tunneling. This will cause and enhanced junction leakage current to flow across the reversed biased diode of the p$^+$ emitter 425 and the n-base 420. Or as shown in FIG. 7d, the electrons e$^-$ 750 are generated from the valence band $E_v$ 755 through conduction band $E_c$ 760 through the depletion layer 715 on the p$^+$ emitter 425 surface by band-to-band tunneling mechanism, they will flow in the n-base 420 and through the inverted channel 700 to the drain 435 of the n-MOS transistor $M_1$ 300 to discharge the storage capacitor C 305.

As can be seen by those skilled in the art, the reversal of the material types to use p-MOS transistors and an npn transistor with appropriate changes in biasing voltages is in keeping with the structure and operation of this invention.

While this invention has been particularly shown and described with reference to the preferred embodiments thereof, it will be understood by those skilled in the art that various changes in form and details may be made without departing from the spirit and scope of the invention.

The invention claimed is:

1. A method to fabricate a plurality of DRAM cells whereby each DRAM cell has a first MOS transistor, a bipolar transistor, and a storage capacitor, wherein said method comprises the steps of:

a) providing a semiconductor wafer;

b) selectively growing an isolation layer upon said semiconductor wafer to define areas upon said semiconductor wafer for said plurality of DRAM cells c) forming a plurality of deep wells of a first conductivity type in the areas defined by said isolation;

d) forming a plurality of wells of the first conductivity and a second conductivity type within the plurality of deep wells;

e) forming said MOS transistors and said bipolar transistors by the steps of:

depositing and etching a gate oxide upon said semiconductor wafer within the plurality of wells of the second conductivity type, depositing, masking, and etching a first polysilicon layer upon said semiconductor wafer to form a gate for each MOS transistor of each DRAM cell, placing a first implant mask and implanting a first material of the first conductivity type adjacent to said gate oxide to form a base of said bipolar transistor, whereby said implanting has a high energy and a large angle, placing a second implant mask and implanting a second material of the second conductivity type within said first material of the first conductivity type and adjacent to said gate to form an emitter of said bipolar transistor, whereby said implanting has a high dosage of said second material of the second conductivity type to ensure a large overlap of said gate of said emitter;

placing of implant masks and implanting lightly doped drains of the first conductivity type to form the drains of the MOS transistor the DRAM cell and drains and sources of peripheral MOS transistors of the first conductivity type, placing of implant masks and implanting lightly doped drains of the second conductivity type to form drains and sources of peripheral MOS transistors of the second conductivity type, depositing and etching back of an insulating material to form a lightly doped drain spacer, and placing of implant masks and implanting sequentially the material of the first conductivity type and the material of the second conductivity type to complete the formation of the drains of the MOS transistor of the DRAM cell and the sources and drains of the peripheral MOS transistors of the first and second conductivity types;

f) forming a plurality of bit-lines upon said semiconductor wafer whereby one bit-lines will contact the emitter of each bipolar transistor within each DRAM cell of the plurality of DRAM cells;

g) forming the storage capacitors within the plurality of DRAM cells; and h) forming of metal interconnections to connect the plurality of DRAM cells as a memory array and to connect memory array to peripheral circuits formed by the peripheral MOS transistors of the first and second conductivity types.

2. The method of claim 1 whereby during forming of said bipolar transistors, the implanting to form said base has the high energy and the large angle to provide a large current gain ($\beta$).

3. The method of claim 1 wherein said overlap of said gate of said emitter is to ensure generation of gate induced drain leakage current at a surface of said semiconductor wafer in the area of said overlap so as to provide a discharge of said storage capacitor during writing of a logical "0" to said storage capacitor.

4. The method of claim 1 whereby during forming of said bipolar transistor, the implanting of the base is accomplished by implanting phosphorus ($P^{31}$) at a range of energy from approximately 50 Kev to approximately 100 Kev to a concentration of from approximately $10^{13}$ to approximately $10^{14}$ electrons per $cm^3$ is present in said base.

5. The method of claim 1 whereby during forming of said bipolar transistor, the implanting of the emitter is accomplished by implanting Boron Fluoride ($BF_2$) at a range of energy of approximately 10 Kev to a concentration of from approximately $10^{15}$ to approximately $10^{16}$ holes per $cm^3$ is present in said emitter.

6. The method of claim 1 whereby said storage capacitor is selected from the group of storage capacitors consisting of stacked capacitors and trench capacitors, and capacitances formed between a gate and source and drain of a second MOS transistor formed within said DRAM cell.

* * * * *